United States Patent
Ok

(10) Patent No.: US 6,693,832 B2
(45) Date of Patent: Feb. 17, 2004

(54) REGISTER CIRCUIT OF EXTENDED MODE REGISTER SET

(75) Inventor: Seung Han Ok, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/254,948

(22) Filed: Sep. 25, 2002

(65) Prior Publication Data

US 2003/0090359 A1 May 15, 2003

(30) Foreign Application Priority Data

Oct. 23, 2001 (KR) ........................................ 2001-65409

(51) Int. Cl.[7] ............................................... G11C 13/00
(52) U.S. Cl. ..................... 365/200; 365/230.05; 326/40
(58) Field of Search ............................. 326/38–41, 104, 326/105; 365/189.05, 200, 230.06, 233, 240

(56) References Cited

U.S. PATENT DOCUMENTS 6,178,126 B1 * 1/2001 Kirihata et al. ............. 365/200
6,407,962 B1 * 6/2002 Ka .............................. 365/233

* cited by examiner

*Primary Examiner*—Vibol Tan
(74) *Attorney, Agent, or Firm*—Ladas & Parry

(57) ABSTRACT

Disclosed is an improved register circuit of an extended mode register set. The register circuit comprises a first mode register block reset by a reset signal and outputting a predetermined level of signal in the input of an extended mode register set signal; a logic block for generating an output signal by OR operation of the reset signal and the mode register set signal and masking the mode register set signal when the predetermined level of signal is inputted from the first mode register block; and a second mode register block reset by output signal of the logic block.

3 Claims, 3 Drawing Sheets

REGISTER CIRCUIT OF EXTENDED MODE REGISTER SET

BACKGROUND OF THE INVENTION

1. Field of the Invention

The present invention relates to a resister circuit of an extended mode register set, and more particularly, to a register circuit of an extended mode register set proposed to accomplish low power consumption in a semiconductor memory device.

2. Description of Related Art

Generally, an extended mode register set (hereinafter, referred to as an "EMRS") proposed to accomplish low power consumption comprises a code for controlling self refresh period (TCSR) and a code for controlling self refresh coverage (PASR), as shown in table 1.

TABLE 1

| BA1 | BA0 | A12 | A11 | A10 | A8 | A7 | A6 | A5 | A4 | A3 | A2 | A1 | A0 |
|---|---|---|---|---|---|---|---|---|---|---|---|---|---|
| 1 | 0 | | | | | | | | TCSR | | | PASR | |

| A4 | A3 | Temperature (max, ° C.) |
|---|---|---|
| 0 | 0 | 70 |
| 0 | 1 | 45 |
| 1 | 0 | 15 |
| 1 | 1 | 85 |

| A2 | A1 | A0 | Self Refresh Coverage |
|---|---|---|---|
| 0 | 0 | 0 | All Banks |
| 0 | 0 | 1 | Banks 0(BA1 = ,BA0 = 0) and 1(BA1 = 1, BA0 = 0) |
| 0 | 1 | 0 | Bank 0(BA1 = BA0 = 0) |
| 0 | 1 | 1 | RFU |
| 1 | 0 | 0 | RFU |
| 1 | 0 | 1 | Low er half of Bank 0(Row Address MSB = 0) |
| 1 | 1 | 0 | Low er quarter of Bank 0 (Row address 2 MSB = 0) |
| 1 | 1 | 1 | RFU |

FIG. 1 is a timing graph of EMRS command. As shown in the drawing, when CKE, /CS, /RAS, /CAS, /WE, BA1, and BA0 are in a state of H, L, L, L, L, H, and L, respectively, EMRS command is generated to set up the value of mode register.

FIG. 2 is a circuit diagram of conventional EMRS register. When EMRS command is not inputted, that is, when EMRS pin maintains low level in FIG. 2, a first inverter (IV1) is operated and a second inverter (IV2) is opened, thereby a register maintains the initial value. However, when a high level signal is applied to EMRS pin, data of pin (LA0 to LA4) are transmitted to a latch and the transmitted data are stored if a low level signal is applied to the EMRS pin. The reset of register is accomplished by a RSTM signal connected to a PUPB and data stored in reset are default values of PASR and TCSR. When a memory including EMRS is used in a chip set having no EMRS command, set up for self refresh period and coverage default value is performed totally by PUPB signal since the EMRS command is not included in a conventional memory spec.

However, considering the case that the PUPB signal is not generated even in power-up, it is required to improve the conventional extended mode register for ensuring stable reset even when the PUPB signal is not generated.

SUMMARY OF THE INVENTION

Therefore, the present invention has been made to solve the above-mentioned problems and an object of the present invention is to provide an extended mode register accomplishing stable reset.

In order to accomplish the above object, the present invention comprises: a first mode register block reset by a reset signal and outputting a predetermined level of signal in the input of extended mode register set signal; a logic block for generating an output signal by OR operation of a reset signal and a mode register set signal and masking a mode register set signal in the input of a predetermined level of signal from the first mode register block; and a second mode register block reset by output signal of the logic block.

The first and the second mode register blocks comprise a plurality of registers. The logic block comprises: a first gate performing a NAND operation to output signal of registers in the first mode register block; a second gate performing an AND operation to output signal of the first gate and a mode register set signal; and, a third gate performing an OR operation to output signal of the second gate and a reset signal.

According to the present invention, the EMRS resister can be reset by pulse type PUPB signal generated in VDD power-up and by the mode register set (hereinafter referred to as MRS). Therefore, when a memory having EMRS is used in a chip set having no EMRS, the EMRS can be stably initialized even in the case that the PUPB signal is not generated. After receiving the EMRS command, the MRS masks data of EMRS command pin to output terminal of stored register to prevent the MRS from performing reset.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF THE PREFERRED EMBODIMENTS

Figure 1:
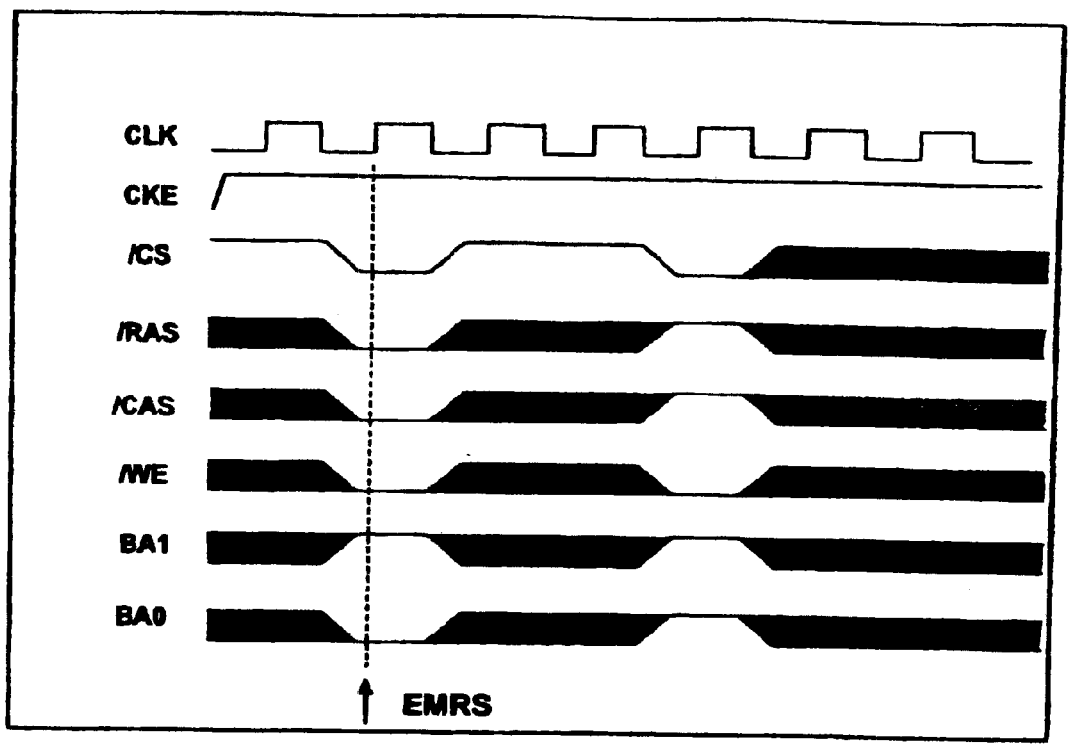
FIG. 1 is a timing graph of EMRS command.
Figure 2:
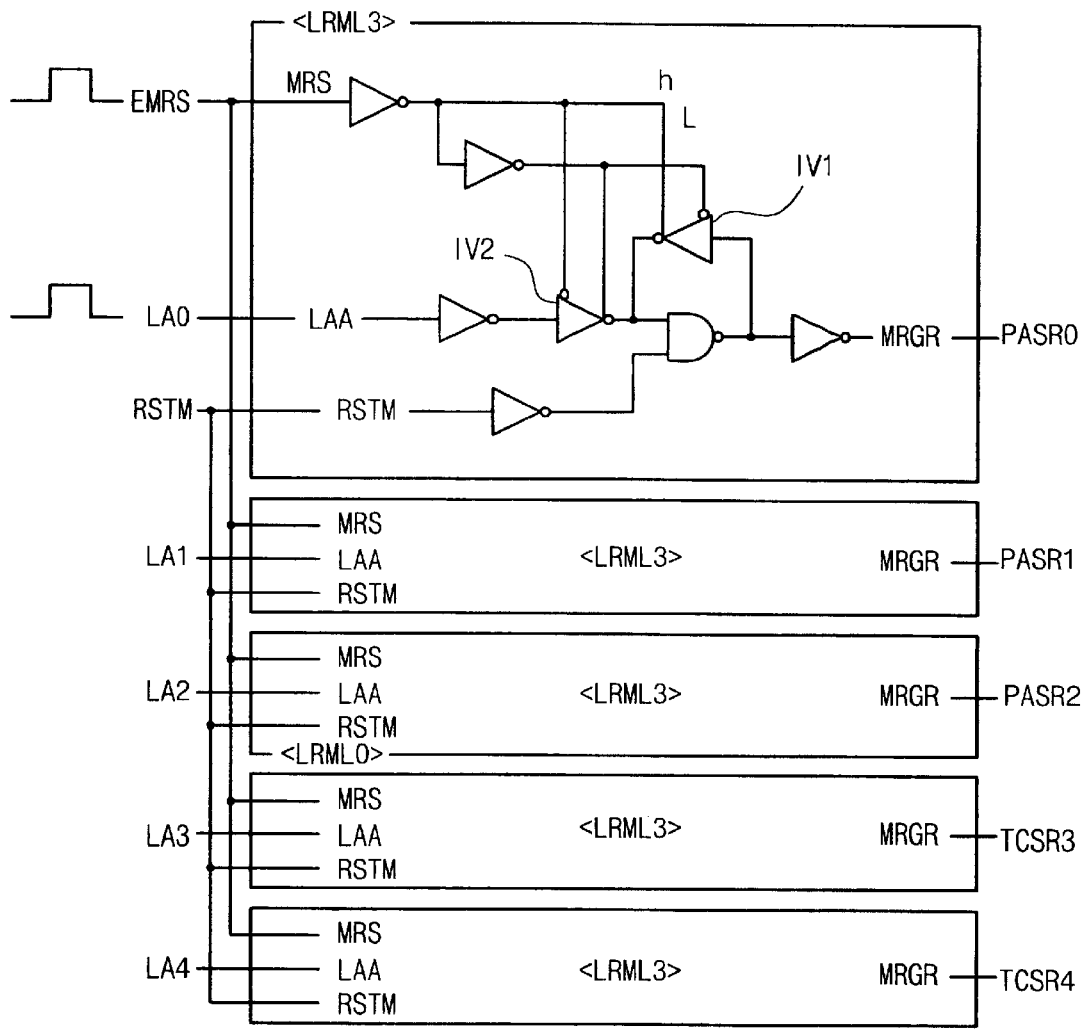
FIG. 2 is a circuit diagram of conventional EMRS register.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
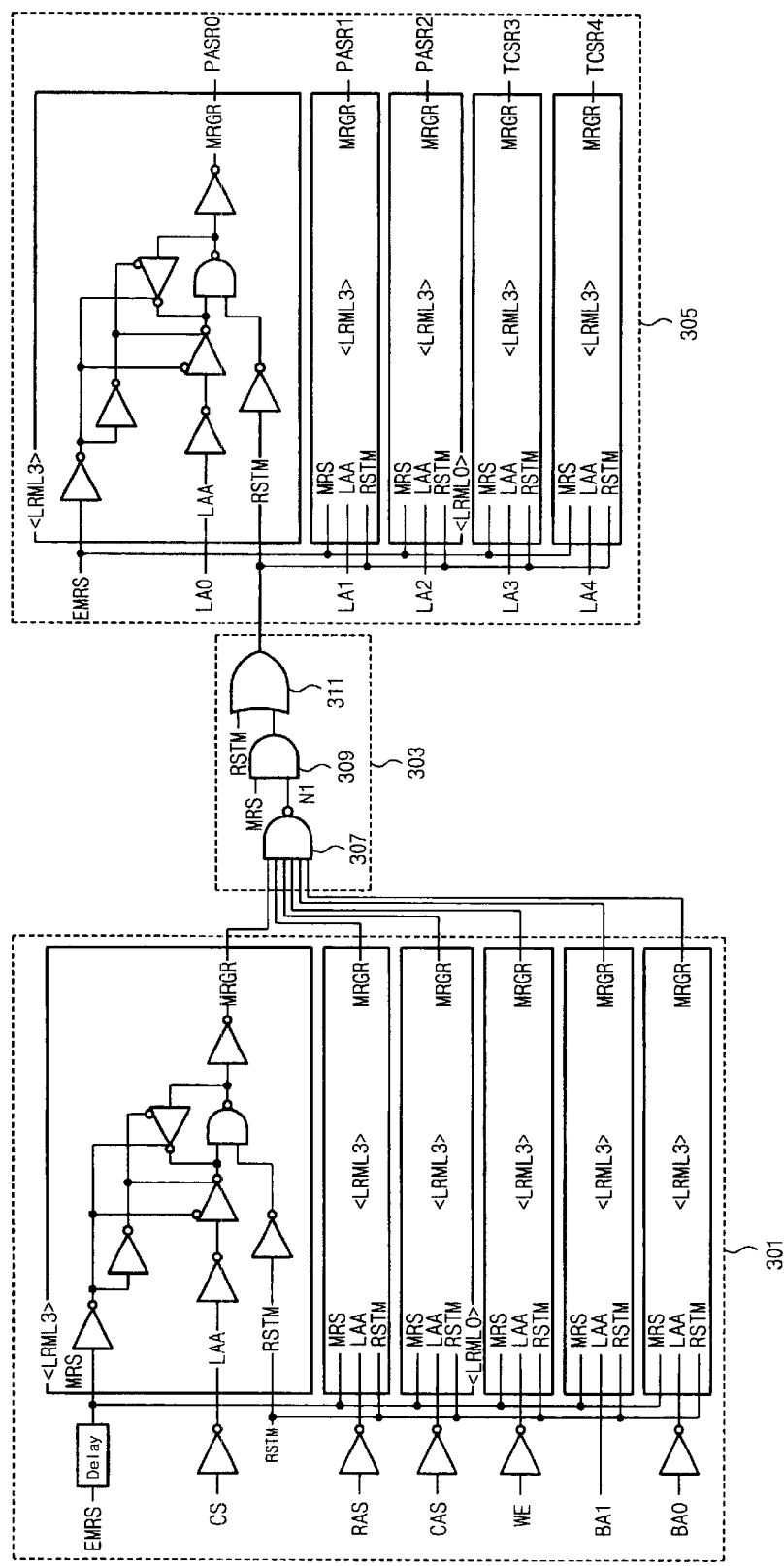
FIG. 3 is a circuit diagram of EMRS register according to an embodiment of the present invention.

FIG. 3 is a circuit diagram of EMRS register according to an embodiment of the present invention. As shown in the drawing, the EMRS register comprises a first mode register block 301 a logic block 303 and a second mode register block 305. In the drawing, EMRS is an extended mode register set signal, RSTM is a reset signal connected to PUPB signal and MRS is a mode register set signal.

The first mode register block 301 is reset by the reset signal RSTM and outputs a predetermined level of signal in the input of EMRS. The first mode register block is the same with B block expect for that LA0–LA4 are replaced by EMRS commands such as CS, CAS, RAS, WE, BA1 and BA0. After receiving the EMRS command, all the registers have high level, thereby node (N1) is changed into low level from high level. The registers employ RSTM as a reset pin, having random variables when the PUPB is not generated. In the case that all the six random variables have high level, node (N1) becomes low level even when the PUPB is not generated and therefore, PASR and TCSR values cannot be reset by the MRS signal. However, this is a very rare case.

As shown in FIG. 3, the logic block 303 comprises: a first gate 307 for performing a NAND operation to output signal of registers forming the first mode register block 301; a second gate 309 for performing an AND operation to output signal of the first gate 307 and the mode register set signal (MRS); and a third gate 311 for performing an OR operation to output signal of the second gate 309 and the reset signal (RSTM). In this structure, the logic block 303 generates an output signal by OR operation of the reset signal (RSTM) and the mode register set signal (MRS). The output signal is used as a reset signal of the second mode register block 305. When the EMRS command is inputted to the first mode register block 301, the mode register set signal (MRS) is masked by output signal of the first mode register block 301.

The second mode register block 305 is reset by output signal of the logic block 303. The first mode register block 301 and the second mode register block 305 comprise a plurality of registers. The second mode register block 305 is the same with the conventional circuit except for a reset input terminal. The reset input terminal additionally comprise MRS signal to the conventional RSTM signal, and node (N1) becomes low level after the EMRS command to prevent the MRS signal from performing reset after receiving the EMRS command. When the register is reset by RSTM or MRS signal, PASR0-PASR2 and TCSR3-TCSR4 have a low level as a default value.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A register circuit in an extended mode register set comprising:

a first mode register block reset by a reset signal and outputting a predetermined level of signal in the input of an extended mode register set signal;

a logic block for generating an output signal by OR operation of the reset signal and the mode register set signal and masking the mode register set signal when the predetermined level of signal is inputted from the first mode register block; and a second mode register block reset by output signal of the logic block.

2. The register circuit in claim 1, wherein the first and the second mode register blocks comprise a plurality of registers.

3. The register circuit in claim 1, wherein the logic block comprises:

a first gate for performing a NAND operation to output signal of registers forming the first mode register block;

a second gate for performing an AND operation to output signal of the first gate and the mode register set signal; and a third gate for performing an OR operation to output signal of the second gate and the reset signal.

* * * * *